United States Patent
Chen et al.

(10) Patent No.: US 10,374,647 B1
(45) Date of Patent: Aug. 6, 2019

(54) ADJUSTABLE DYNAMIC RANGE SIGNAL DETECTION CIRCUIT

(71) Applicant: TEXAS INSTRUMENTS INCORPORATED, Dallas, TX (US)

(72) Inventors: Jikai Chen, Allen, TX (US); Yuan Rao, Allen, TX (US); Yanli Fan, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/895,648

(22) Filed: Feb. 13, 2018

(51) Int. Cl.
*G05F 3/26* (2006.01)
*G05F 3/30* (2006.01)
*H04B 1/16* (2006.01)
*H03K 5/153* (2006.01)

(52) U.S. Cl.
CPC ............... *H04B 1/16* (2013.01); *G05F 3/26* (2013.01); *G05F 3/30* (2013.01); *H03K 5/153* (2013.01)

(58) Field of Classification Search
CPC  G01M 7/00; G01M 7/022; G05F 3/00; G05F 3/26; G05F 3/30; G06G 7/00; G06G 7/18; G06G 7/184; G06G 7/186; H03H 11/00; H03H 11/12; H03K 5/00; H03K 5/153; H04B 1/00; H04B 1/16
USPC ......................................................... 327/335
See application file for complete search history.

(56) References Cited

U.S. PATENT DOCUMENTS

| | | | |
|---|---|---|---|
| 4,085,411 A | 4/1978 | Genesi | |
| 2005/0093617 A1* | 5/2005 | Min | G05F 3/30 327/538 |
| 2009/0027372 A1 | 1/2009 | Shishido et al. | |
| 2010/0072972 A1* | 3/2010 | Yoshikawa | G05F 3/30 323/313 |
| 2013/0068926 A1* | 3/2013 | Okada | G01J 1/44 250/206 |
| 2014/0340100 A1* | 11/2014 | Popa | G01R 27/00 324/691 |
| 2018/0092167 A1* | 3/2018 | Park | H05B 33/0818 |

FOREIGN PATENT DOCUMENTS

WO    2009065860    5/2009

OTHER PUBLICATIONS

International Search Report in corresponding PCT Application No. PCT/US2019/017752, dated May 30, 2019 (2 pages).

* cited by examiner

*Primary Examiner* — Lincoln D Donovan
*Assistant Examiner* — Dave Mattison
(74) *Attorney, Agent, or Firm* — John R. Pessetto; Charles A. Brill; Frank D. Cimino

(57) ABSTRACT

A circuit includes a sensor configured to receive an input signal and to provide a sensor output signal in response to the received input signal. A plurality of mirror circuits are configured to receive the sensor output signal from the sensor and to generate mirror circuit output signals. The plurality of mirror circuits includes a first mirror circuit and at least a second mirror circuit. The first mirror circuit increases its respective mirror circuit output signal until its saturation value is reached. The second mirror circuit increases its respective mirror output signal if the sensor output signal is above a threshold value and until its saturation value is reached.

4 Claims, 4 Drawing Sheets

ADJUSTABLE DYNAMIC RANGE SIGNAL DETECTION CIRCUIT

TECHNICAL FIELD

This disclosure relates to electrical circuits, and more particularly to a signal detection circuit that dynamically changes its sensitivity level based on detected input conditions.

BACKGROUND

Received signal strength detectors in some wireless, wired, or optical receivers have to provide low offset current (e.g., <<1 microampere) when small input signals are present, while providing wide (e.g., >1000×) dynamic range for signal detection (e.g., signals detected below 1 microampere to a few milliamperes). Existing circuits employ a single current mirror to replicate the received signal current at the detector output. Increasing the channel length (L) of the current mirror to meet the low offset current requirement results in prohibitively large area for the respective transistor devices of the single current mirror. Reducing the channel length helps the current mirror at higher current values however the low signal response of the detector suffers. Trimming the offset current adds cost to the circuit and is not available in many manufacturing processes.

SUMMARY

This disclosure relates to a signal detection circuit that dynamically changes its sensitivity level based on detected input conditions. In one example, a circuit includes a sensor configured to receive a wireless input signal and to provide a sensor output signal in response to the received wireless input signal. A plurality of mirror circuits are configured to receive the sensor output signal from the sensor and to generate mirror circuit output signals. The plurality of mirror circuits includes a first mirror circuit and at least a second mirror circuit. The first mirror circuit increases its respective mirror circuit output signal until its saturation value is reached. The second mirror circuit increases its respective mirror output signal if the sensor output signal is above a threshold value and until its saturation value is reached.

In another example, a circuit includes a sensor configured to receive an input signal and to provide a sensor output signal in response to the received input signal. The circuit includes a mirror circuit configured to receive the sensor output signal from the sensor and to generate a mirror circuit output signal. The mirror circuit increases a magnitude of the mirror circuit output signal based on increases of the sensor output signal and before the mirror circuit reaches a saturation value. At least one other mirror circuit is configured to receive the sensor output signal from the sensor and to generate at least one other mirror circuit output signal. The other mirror circuit output signal is generated in response to the sensor output signal and if the sensor output signal is above a threshold value. The mirror circuit output signal and the other mirror circuit output signal are combined to generate a detection signal to indicate a signal strength of the sensor output signal.

In yet another example, a method includes providing a sensor output signal in response to a received input signal. The method includes generating separate mirror circuit output signals from separate mirror circuits in response to signal variances of the sensor output signal. Each of the separate mirror circuit output signals are generated in response to different signal levels of the sensor output signal. The method includes generating a signal strength indication for the input signal based on monitoring of the separate mirror circuit output signals.

DETAILED DESCRIPTION

This disclosure relates to a signal detection circuit that dynamically changes its sensitivity level based on detected input conditions. The signal detection circuit includes a sensor configured to receive an input signal (e.g., wireless or wired) and to provide a sensor output signal in response to the received input signal. The sensor can be substantially any type of sensor for receiving signals such as an optical sensor, for example, used in an optical receiver. Other type sensors may also be employed. A plurality of mirror circuits are configured to receive the sensor output signal from the sensor. Each of the mirror circuits generates mirror circuit output signals in response to the sensor output signal. The plurality of mirror circuits include a first mirror circuit and at least a second mirror circuit. The first mirror circuit increases its respective mirror circuit output signal until its saturation value is reached. The second mirror circuit generates a respective mirror output signal if the sensor output signal is above a threshold value. The mirror output signals in the subsequent stages increases until their respective saturation values are reached.

Each mirror circuit includes a pair of transistor switch devices that are configured with a length parameter (L) that defines the current capability of the devices. Two (or more) mirror circuits with different length parameters L can operate in parallel to process the sensor output signal from the sensor and over a large dynamic operating range of the sensor. When the input current is low (e.g., below a detected threshold value), the mirror circuit with the largest L parameter is on, and thus presents a low offset value for the detector at low detected signal levels. When the input current is high from the sensor (e.g., signal level above threshold value), the mirror circuit with a smaller L value is switched on and thus presents high dynamic range to accommodate the larger input current value. Gradual analog range control and switching provides continuous operation over the input range, mitigating possible service interruption by avoiding abrupt digital range switching.

As used herein, the term "circuit" can include a collection of active and/or passive elements that perform a circuit function, such as an analog circuit or control circuit. Additionally or alternatively, for example, the term "circuit" can include an integrated circuit (IC) where all or some of the circuit elements are fabricated on a common substrate (e.g., semiconductor substrate, such as a die or chip).

Figure 1:
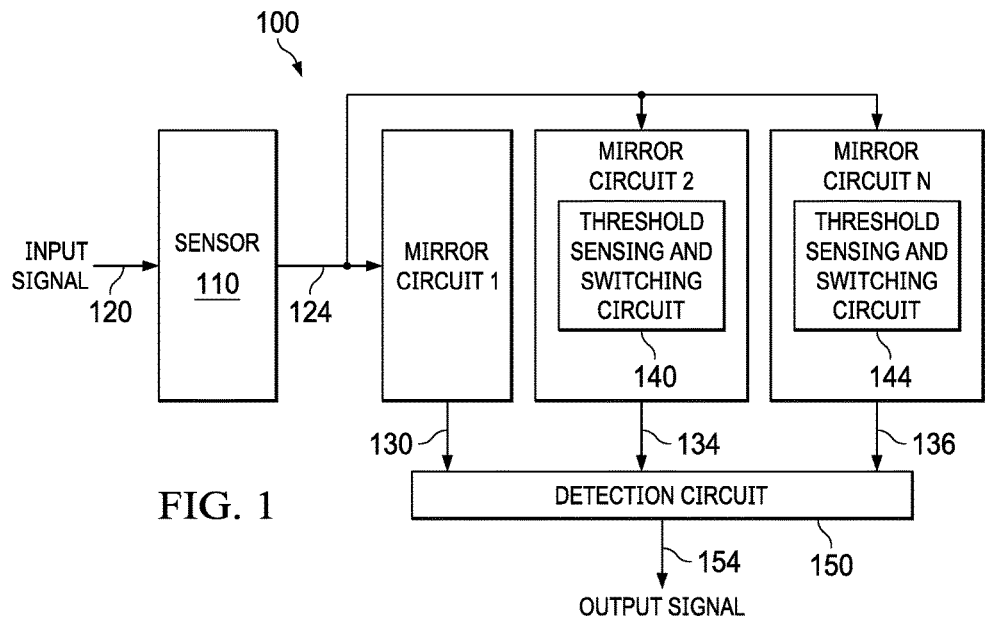
FIG. 1 illustrates an example block diagram of a signal detection circuit that employs multiple mirror circuits for detecting input signals.

FIG. 1 illustrates an example of a signal detection circuit 100 that employs multiple mirror circuits for detecting input signals. The circuit 100 includes a sensor 110 configured to receive an input signal 120 (e.g., wired or wireless input signal) and to provide a sensor output signal 124 in response to the received wireless input signal. A plurality of mirror circuits shown as mirror circuit 1 though N, with N being a positive integer, are configured to receive the sensor output signal 124 from the sensor 110 and to generate mirror circuit output signals 130, 134, and 136 from each of the mirror circuits 1 through N. As used herein, the term mirror circuit refers to a circuit that employs a pair of transistor switch devices (e.g., metallic oxide semiconductor device) sharing a common gate connection. One of the pair of transistors receive an input at their respective source connection and the other of the pair of switch devices mirrors the input at an output connection provided by the source connection of the other device. Another term for the mirror circuit is a current mirror.

Each of the plurality of mirror circuits 1-N are configured to generate the respective mirror circuit output signals 134-136 at different signal strengths of the sensor output signal. In one example, the plurality of mirror circuits include the first mirror circuit shown as mirror circuit 1 and at least a second mirror circuit shown as mirror circuit 2. The first mirror circuit increases its respective mirror circuit output signal 130 until its saturation value is reached. The second mirror circuit generates a respective mirror output signal 134 if the sensor output signal is above a threshold value and until its saturation value is reached. As shown, mirror circuit 2 and mirror circuit N may also include threshold sensing and switch circuits 140 and 144, respectively. These circuits 140 and 144 enable mirror circuit 2 and/or mirror circuit N to turn on if the input signal exceeds a threshold. The mirror circuit 1 turns on at low current values and continues to conduct up to a saturation point where the circuit saturates on its own and thus does not employ its own threshold and switching circuit. Large dynamic range is provided by the circuit 100 since mirror circuit 1 is configured with a large length parameter (L) to support low current values and low offsets since the transistor pair of the mirror circuit can be tightly matched by having a higher configured L value. At higher current values of the input signal 120, the subsequent mirror stages 2 though N can be activated via their respective threshold and switching circuits 140 and 144 based on the detected current level of the input. These mirror circuits 2-N can be dynamically switched on based on input current conditions and configured with lower L values to support higher currents.

The mirror circuit output signals 130-136 can be generated by the plurality of mirror circuits 1-N if the sensor output signal 124 exceeds a threshold value (e.g., threshold set for 10 microamperes). As will be shown and described below with respect to FIG. 4, the circuit 100 can include a constant current source that includes a current source output configured to set the threshold value. Each of the plurality of mirror circuits 1-N includes a pair of transistor switch devices coupled via a common gate connection. The pair of the transistor switch devices in each mirror circuit 1-N include a length parameter (L) that defines a current capability of the transistor switch devices. One of pair of transistor switch devices for one of the plurality of mirror circuits such as mirror circuit 1 can be configured with a length parameter that is greater than the length parameter of another pair of transistor switch devices for at least one other of the mirror circuits 2-N.

The sensor 110 can be an optical sensor, a current sensor, or a voltage sensor to receive the input signal 120 and to provide the sensor output signal 124 in response to the received input signal. An amplifier circuit (see e.g., FIG. 4) can be provided to set a bias voltage for the sensor 110 based on a reference voltage. A detection circuit 150 (e.g., resistor or network to convert output current from mirror circuits to voltage which can be digitized and/or compared for signal strength value) can be configured to receive the mirror circuit output signals 130-136 from each of the mirror circuits 1-N and combine them to determine the signal strength of the input signal 120. The detection circuit 1-N generates a detection circuit output signal 154 that indicates the signal strength of the wireless input signal 120. In one example, the circuit 100 can be employed as a received signal strength indicator for an optical receiver where the detection circuit indicates a signal strength value for the input signal 120 which indicates received optical signal strength. In other examples, the circuit 100 can be employed as a wireless or wired signal detector where signals of varying signal strengths are detected and reported via the detection circuit 150.

Figure 2:
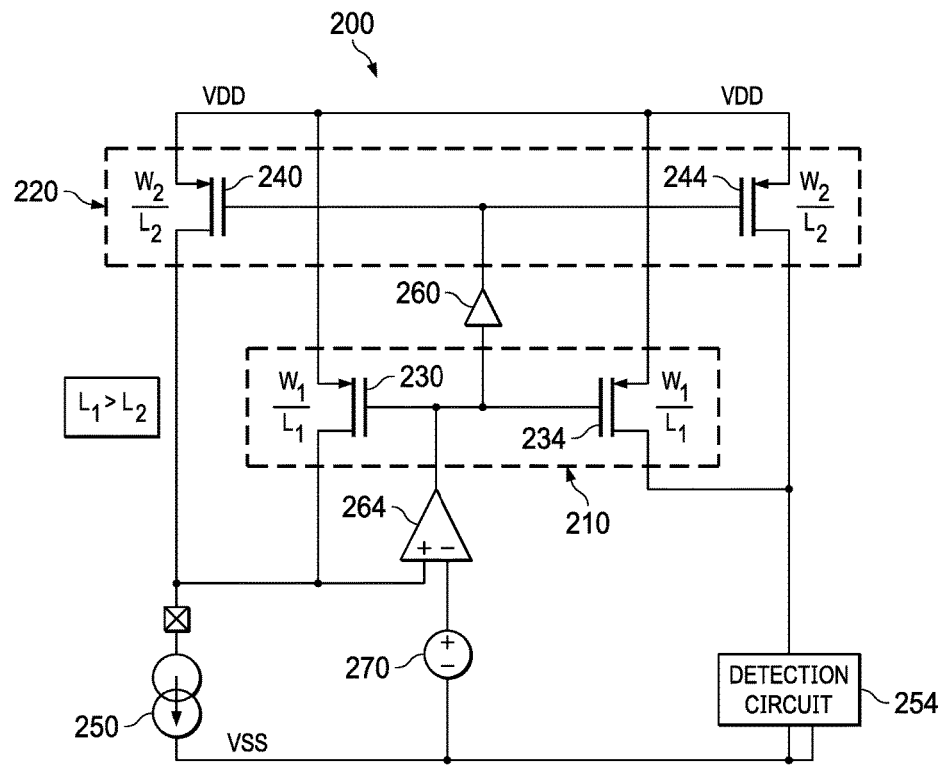
FIG. 2 illustrates an example block diagram of a signal detection circuit that employs two mirror circuits for detecting input signals.

FIG. 2 illustrates an example of a signal detection circuit 200 that employs two mirror circuits 210 and 220 for detecting input signals. The mirror circuit 210 includes transistor switch devices 230 and 234 which share a common gate connection. The mirror circuit 220 includes transistor switch devices 240 and 244 which share a common gate connection. Each of the mirror circuits 210 and 220 receive a wireless signal output at transistor switch devices 230 and 240 from a sensor 250 (e.g., optical sensor) and provide an output via switch devices 234 and 244, respectively, to a detection circuit 254. As shown, the switch devices of mirror circuit 210 have a length parameter (L) that is configured greater than the length parameter of the mirror circuit 220. A threshold and switching circuit 260 is provided to turn on the mirror circuit 220 at higher current values of the sensor output signal. An amplifier 264 receives a reference voltage 270 and is provided to set a desired bias voltage for the sensor 250.

Figure 3:
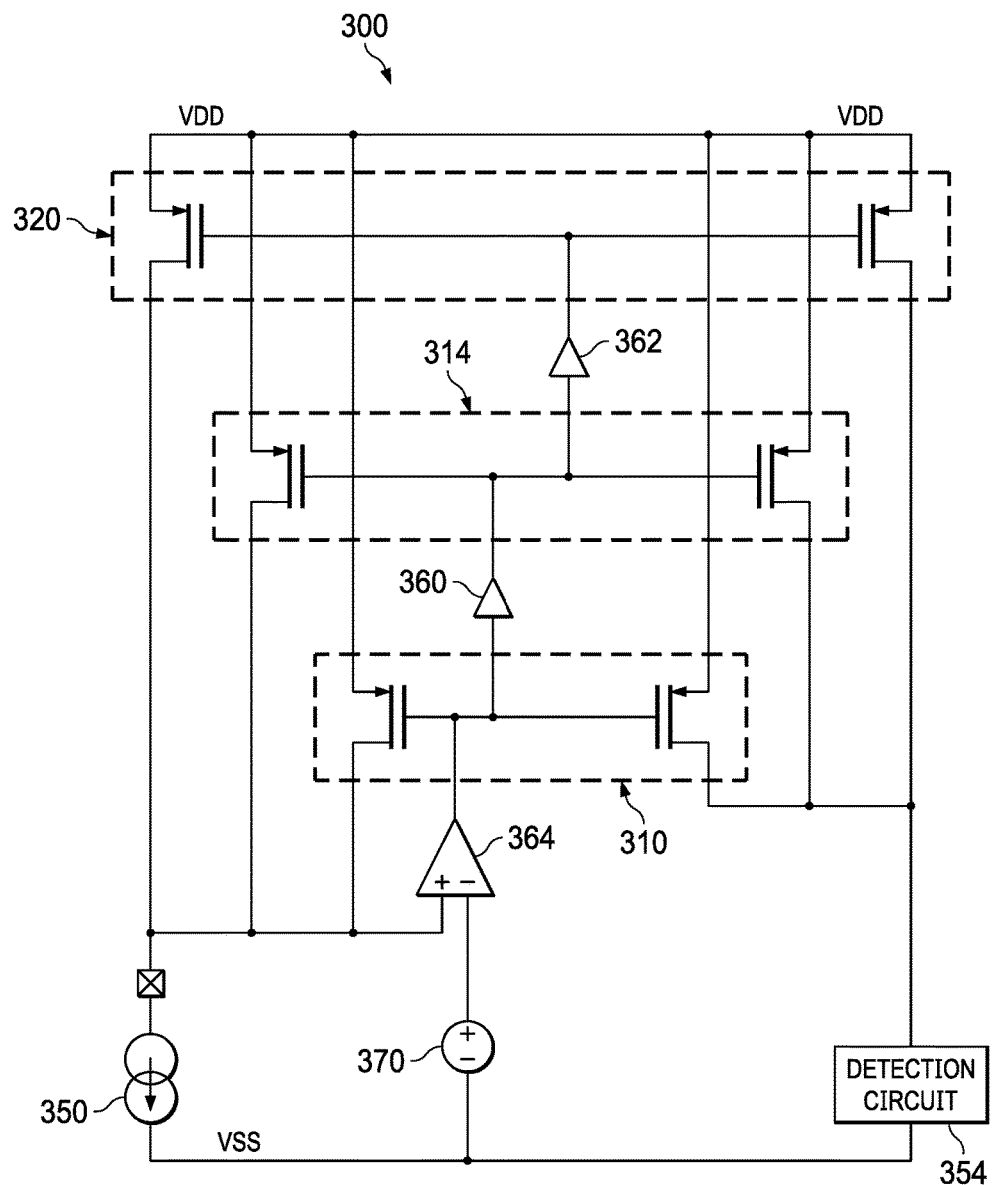
FIG. 3 illustrates an example block diagram of a signal detection circuit that employs three mirror circuits for detecting input signals.

FIG. 3 illustrates an example signal detection circuit 300 that employs three mirror circuits 310, 314, and 320 for detecting input signals. Similar to FIG. 2, the mirror circuits 310, 314, and 320 include transistor switch devices which share a common gate connection. Each of the mirror circuits 310-314 receive a wireless signal from a wireless sensor 350 (e.g., optical sensor) and provide an output via to a detection circuit 354. The switch devices of mirror circuit 310 have a length parameter (L) that is configured greater than the length parameter of the mirror circuit 314 and 320, whereas the length parameter L for the transistor switch devices mirror circuit 314 can be set greater than the length parameter of the transistor switch devices of the mirror circuit 320. A threshold and switching circuit 360 and 362 is provided to turn on the mirror circuits 314 and 320 respectively at higher current values of the sensor output signal. An amplifier 364 receives a reference voltage 370 and is provided to set a desired bias voltage for the sensor 250. Although 2 and 3 mirror circuit stages are shown in the examples of FIGS. 2 and 3, N such mirror circuit stages can be provided as previously described with respect to FIG. 1.

Figure 4:
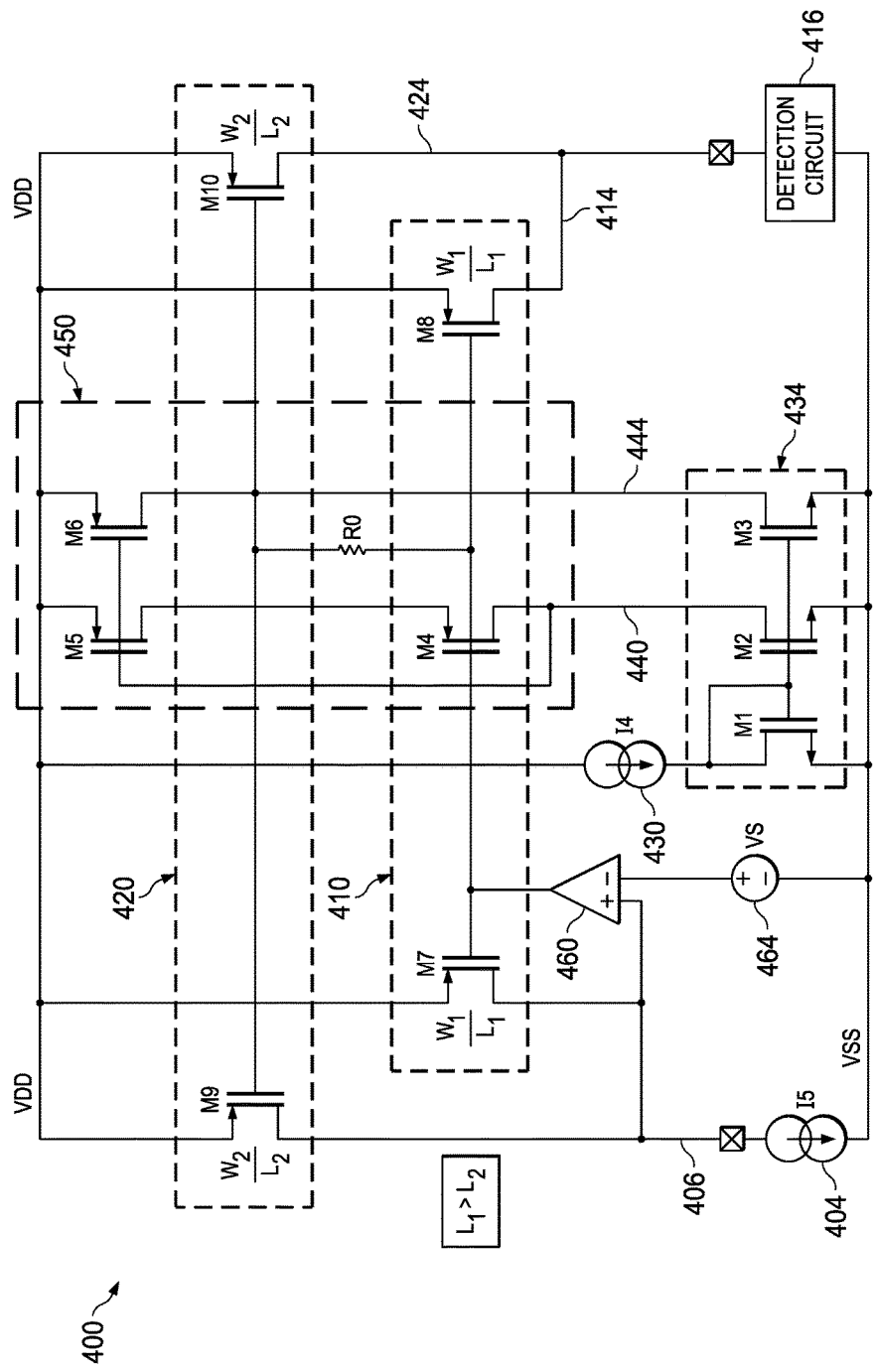
FIG. 4 illustrates a circuit example of a signal detection circuit that employs multiple mirror circuits for detecting input signals.

FIG. 4 illustrates a circuit example of a signal detection circuit 400 that employs multiple mirror circuits for detecting input signals. A sensor 404 is configured to receive an input signal (e.g., optical signal) and to provide a sensor output signal 406 in response to the received input signal. A mirror circuit 410 (including transistors M7 and M8) is configured to receive the sensor output signal 406 from the sensor 404 and to generate a mirror output signal 414 to a detection circuit 416. The mirror circuit 410 increases a magnitude of the mirror circuit output signal 414 based on increases of the sensor output signal 406 and before the mirror circuit reaches a saturation value. At least one other mirror circuit shown as mirror circuit 420 (including transistors M9 and M10) in this example is configured to receive the sensor output signal from the sensor 404 and to generate at least one other mirror circuit output signal 424 to the detection circuit 416. The other mirror circuit output signal 424 is generated in response to the sensor output signal 406 and if the sensor output signal is above a threshold value. The mirror circuit output signal 414 and other mirror circuit output signal 424 are combined at the detection circuit 416 and to generate a detection signal to indicate a signal strength of the sensor output signal 406.

A constant current source 430 includes a current source output configured to set the threshold value. A threshold detector mirror circuit 434 consisting of transistor switch devices M1, M2, and M3 is configured to compare the sensor output signal 406 to the current source output. The threshold detector mirror circuit 434 is configured to generate control signals 440 and 444 to activate the mirror circuit 420 if the sensor output signal 406 exceeds the threshold value set by the current source 430. A switching circuit 450 includes transistor switch devices M4, M5, and M6 that activates the mirror circuit 420 in response to the control signals 440 and 444 if the sensor output signal exceeds the threshold value set by the current source 430. The switching circuit 450 includes a sense resistor RO and a switching circuit current mirror composed of M5 and M6 configured to control switching of the switching circuit. The sense resistor RO is coupled between the mirror circuit 410 and the mirror circuit 420 and provides switching control of the switching circuit current mirror M5 and M6 in response to the control signals 440 and 444 from the threshold detector mirror circuit 434.

As shown, the mirror circuit 410 includes transistor switch devices M7 and M8 whereas the mirror circuit 420 includes transistor switch devices M9 and M10. The pair of the transistor switch devices in each mirror circuit 410 and 420 includes a length parameter that defines a current capability of the transistor switch devices. One of the pair of transistor switch devices for the mirror circuit 410 is configured with a length parameter that is greater than the length parameter of the transistor switch devices for the mirror circuit 420. An amplifier 460 receives a reference voltage 464 and is provided to set a bias current for the sensor 404.

Figure 5:
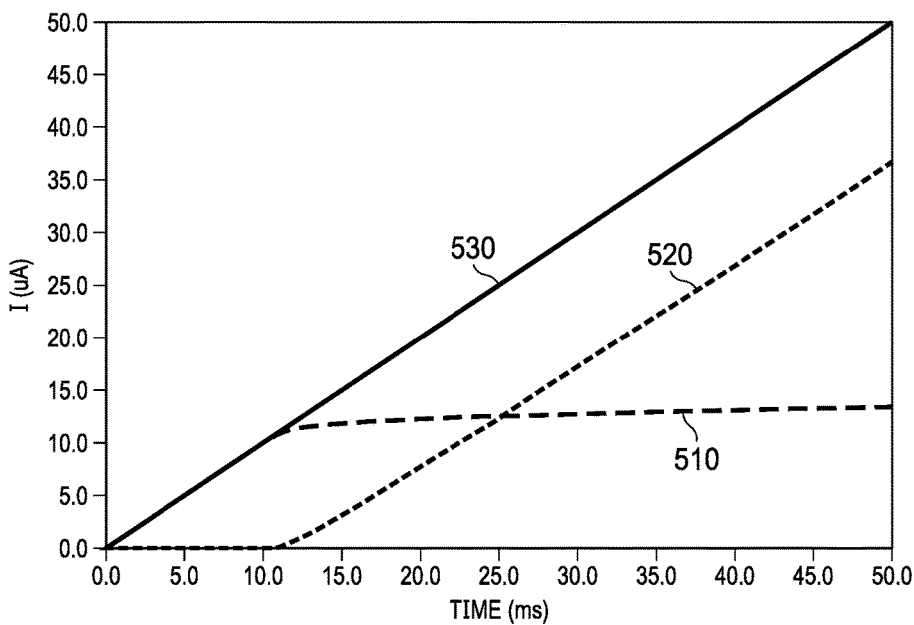
FIG. 5 illustrates an example signal diagram that illustrates the current output from the mirror circuits of FIG. 4.

FIG. 5 illustrates an example signal diagram 400 that illustrates the current output from the mirror circuits of FIG. 4. Combined current output in micro amperes from the respective mirror circuits is shown on the vertical axis and time in milliseconds is shown on the horizontal axis. As shown, at current levels below 11 micro amperes, signal output 510 is generated to the detection circuit by the first mirror circuit. After about 12 milliseconds the input signal current exceeds a threshold, the signal 510 goes into saturation yet the signal output is now provided by the second current mirror at 520. The combined signal current provided to the detection circuit from the mirror circuits is shown at 530. As shown, switching between the current mirror outputs is substantially seamless and smooth which is facilitated by the threshold and switching circuits described herein.

Figure 6:
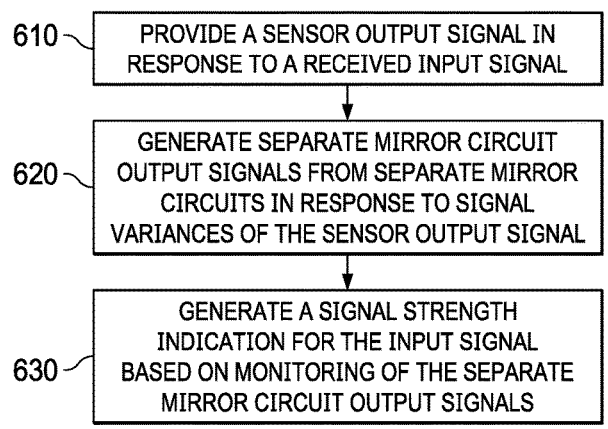
FIG. 6 illustrates an example method for detecting input signals.

In view of the foregoing structural and functional features described above, an example method will be better appreciated with reference to FIG. 6. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various hardware circuits and components configured to execute machine readable instructions stored in memory and executable by an integrated circuit or a processor, for example.

FIG. 6 illustrates an example method for detecting input signals. At 6100, the method 600 includes providing a sensor output signal in response to a received input signal. At 620, the method 600 includes generating separate mirror circuit output signals from separate mirror circuits in response to signal variances of the sensor output signal. Each of the separate mirror circuit output signals are generated in response to different signal levels of the sensor output signal. At 630, the method 600 includes generating a signal strength indication for the input signal based on monitoring of the separate mirror circuit output signals. Although not shown, the method can also include generating the separate mirror circuit output signals if the sensor output signal exceeds a threshold value.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit, comprising:
   a sensor configured to receive an input signal and to provide a sensor output signal in response to the received input signal; and
   a plurality of mirror circuits configured to receive the sensor output signal from the sensor and to generate mirror circuit output signals, the plurality of mirror circuits include a first mirror circuit and at least a second mirror circuit, wherein the first mirror circuit increases its respective mirror circuit output signal until its saturation value is reached and the second mirror circuit increases its respective mirror output signal if the sensor output signal is above a threshold value and until its saturation value is reached;
   wherein each of the plurality of mirror circuits include a pair of transistor switch devices coupled via a common gate connection, the pair of the transistor switch devices include a length parameter that defines a current capability of the transistor switch devices;
   wherein one of pair of transistor switch devices for one of the plurality of mirror circuits is configured with a length parameter that is greater than the length parameter of another pair of transistor switch devices for at least one other of the plurality of mirror circuits.

2. A circuit, comprising:

a sensor configured to receive an input signal and to provide a sensor output signal in response to the received input signal;

a mirror circuit configured to receive the sensor output signal from the sensor and to generate a mirror circuit output signal, the mirror circuit increases a magnitude of the mirror circuit output signal based on increases of the sensor output signal and before the mirror circuit reaches a saturation value;

at least one other mirror circuit configured to receive the sensor output signal from the sensor and to generate at least one other mirror circuit output signal, the at least one other mirror circuit output signal is generated in response to the sensor output signal and if the sensor output signal is above a threshold value, the mirror circuit output signal and the at least one other mirror circuit output signal are combined to generate a detection signal to indicate a signal strength of the sensor output signal;

wherein each of the mirror circuit and the at least one other mirror circuit includes a pair of transistor switch devices coupled via a common gate connection, the pair of the transistor switch devices include a length parameter that defines a current capability of the transistor switch devices;

wherein one of pair of transistor switch devices for the mirror circuit is configured with a length parameter that is greater than the length parameter of another pair of transistor switch devices for the at least one other mirror circuit.

3. A method, comprising:

providing a sensor output signal in response to a received input signal;

generating separate mirror circuit output signals from separate mirror circuits in response to signal variances of the sensor output signal, wherein each of the separate mirror circuit output signals are generated in response to different signal levels of the sensor output signal; and generating a signal strength indication for the input signal based on monitoring of the separate mirror circuit output signals.

4. The method of claim 3, further comprising generating the separate mirror circuit output signals if the sensor output signal exceeds a threshold value.

* * * * *